United States Patent
Malone (10) Patent No.: US 6,454,587 B1
(45) Date of Patent: Sep. 24, 2002

(54) ASSEMBLY FOR MOUNTING A BUS TERMINATION DEVICE TO A PRINTED CIRCUIT BOARD (PCB)

(75) Inventor: Christopher G. Malone, Folsom, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/698,559

(22) Filed: Oct. 27, 2000

(51) Int. Cl.[7] ............................................. H01R 13/62
(52) U.S. Cl. ........................................ 439/331; 439/73
(58) Field of Search ........................... 439/331, 71, 73, 439/70

(56) References Cited

U.S. PATENT DOCUMENTS

| | | | |
|---|---|---|---|
| 4,376,560 A | | 3/1983 | Olsson et al. .................. 339/17 |
| 4,396,935 A | * | 8/1983 | Schuck |
| 4,506,938 A | | 3/1985 | Madden ........................ 339/17 |
| 4,540,226 A | | 9/1985 | Thompson et al. ............ 339/17 |
| 5,249,972 A | * | 10/1993 | Walker ......................... 439/73 |
| 5,259,781 A | * | 11/1993 | Baumberger et al. ......... 439/66 |
| 5,926,370 A | | 7/1999 | Cromwell ................... 361/700 |
| 5,959,244 A | * | 9/1999 | Mayer ......................... 439/609 |
| 6,042,412 A | * | 3/2000 | Murr ........................... 439/331 |
| 6,084,178 A | | 7/2000 | Cromwell ..................... 174/35 |
| 6,086,387 A | * | 7/2000 | Gallagher et al. .......... 439/331 |

* cited by examiner

Primary Examiner—Tho D. Ta (57) ABSTRACT

A mounting assembly for providing bus termination of a signal line on a printed circuit board (PCB). The mounting assembly includes a connector arrangement, a bus termination device, pressure plate and a clamping mechanism. The bus termination device is received by the connector arrangement, such that electrical interface elements of the bus termination device engage electrical interface elements of the connector arrangement to provide electrical communication between the connector arrangement and the signal line of the PCB. The clamping mechanism is engageable with the bus termination device for maintaining electrical contact between the electrical interface elements for securing the connector arrangement and bus termination device to the PCB. The pressure plate member is interposed between the clamping mechanism and the bus termination board. The pressure plate member protects resistor packages on the bus termination device from damage as a result of clamping forces imparted by the clamping mechanism to the bus termination board through the pressure plate member. The pressure plate member defines a plurality of resistor package pockets for receiving the resistor packages to prevent the clamping forces from being imparted to the resistor packages.

40 Claims, 7 Drawing Sheets

ASSEMBLY FOR MOUNTING A BUS TERMINATION DEVICE TO A PRINTED CIRCUIT BOARD (PCB)

TECHNICAL FIELD

This invention relates generally to printed circuit boards (PCB's). In particular, the present invention is an assembly for mounting a bus termination board, having surface-mount resistors, to a connector arrangement on a PCB to provide bus termination of a signal line. The mounting assembly includes a pressure plate that surrounds the surface-mount resistors of the termination board and protects these resistors from the significant forces required to provide sufficient electrical contact between the termination board and the connector arrangement on the PCB.

BACKGROUND OF THE INVENTION

Printed circuit boards (PCB's) with electrical components are widely used in the electronics industry in a variety of products including computers, televisions and telecommunication devices. These devices often make use of signal lines that are mounted to the PCB's using a connector arrangement. In these devices it is common to provide bus termination of these signal lines at the connector arrangement using resistor packages. Typically these resistor packages are held in place on the connector arrangement using a bus termination clamping arrangement. This bus termination clamping arrangement imparts a significant clamping force to the resistor packages that is sufficient to provide the necessary electrical contact between the resistor packages and the PCB through the connector arrangement.

Although this system provides adequate bus termination of a signal line at the connector arrangement of the PCB, there are some drawbacks. For example, these resistor packages typically must be individually hand loaded onto the connector arrangement of the PCB which is labor intensive and impractical for mass production. Moreover, these resistor packages are often quite fragile since they are not rigidly attached to the connector arrangement. As such, these resistor packages, that provide bus termination at the PCB, are susceptible to inadvertent damage caused by the significant clamping forces, imparted by the bus termination clamping arrangement, necessary to provide sufficient electrical contact between the resistor packages and the connector arrangement. Moreover, these resistor packages are susceptible to inadvertent damage during routine handling of the PCB.

There is a need for an improved assembly for mounting resistors to a connector arrangement on a PCB to provide bus termination of a signal line. In particular, there is a need for a bus termination mounting assembly that makes use of resistors surface mounted to a bus termination board to permit mass production and eliminate the need to individually hand load the resistors onto the connector arrangement of the PCB. In addition, the bus termination mounting assembly should protect these surface-mount resistors from the significant forces necessary to provide sufficient electrical contact between the surface-mount resistors of the termination board and the connector arrangement of the PCB. Moreover, the bus termination mounting assembly should protect the surface-mount resistors from inadvertent damage caused by routine handling of the PCB. Lastly, the bus termination mounting assembly should be relatively easy and inexpensive to manufacture.

SUMMARY OF THE INVENTION

The present invention is a mounting assembly for providing bus termination of at least one signal line on a printed circuit board (PCB). The mounting assembly includes a connector arrangement, a bus termination device and a clamping mechanism. The connector arrangement includes a plurality of electrical interface elements configured to provide electrical communication between the connector arrangement and the at least one signal line of the PCB when the connector arrangement is secured to the PCB. The bus termination device is configured to be received by the connector arrangement. The bus termination device has a plurality of corresponding electrical interface elements for engaging the plurality of electrical interface elements of the connector arrangement for providing bus termination of the signal line of the PCB. The clamping mechanism is engageable with the bus termination device for maintaining electrical contact between the plurality of corresponding electrical interface elements of the bus termination device and the plurality of electrical interface elements of the connector arrangement. The clamping mechanism secures the connector arrangement and bus termination device to the PCB.

In one aspect of the present invention, the bus termination device includes a bus termination board having a first surface and an opposite second surface. The first surface includes a plurality of spaced resistor packages operatively connected to the plurality of corresponding electrical interface elements on the second surface of the bus termination board. A pressure plate member is interposed between the clamping mechanism and the bus termination board, the pressure plate member protects the plurality of spaced resistor packages from damage as a result of clamping forces imparted by the clamping mechanism to the bus termination board through the pressure plate member. In particular, the pressure plate member defines a plurality of resistor package pockets for receiving the plurality of spaced resistor packages. The resistor package pockets substantially prevent the clamping forces imparted by the clamping mechanism to the bus termination board from being imparted to the plurality of spaced resistor packages.

In another embodiment, the present invention provides a mounting assembly for providing bus termination of at least one signal line on a printed circuit board (PCB). The mounting assembly includes a connector arrangement, a bus termination board and a pressure plate member. The connector arrangement includes a plurality of electrical interface elements configured to provide electrical communication between the connector arrangement and the at least one signal line of the PCB when the connector arrangement is secured to the PCB. The bus termination board is configured to be received by the connector arrangement. The bus termination board has a first surface that includes a plurality of corresponding electrical interface elements for engaging the plurality of electrical interface elements of the connector arrangement, and a second surface having a plurality of spaced resistor packages for providing bus termination of the signal line of the PCB. The pressure plate member engages the second surface of the bus termination board for protecting the plurality of spaced resistor packages from damage.

This mounting assembly to provide bus termination for a signal line of the present invention makes use of resistor packages surface mounted to a bus termination board to permit mass production and eliminate the need to individually hand load the resistors onto the connector arrangement of the PCB. In addition, the pressure plate member of this bus termination mounting assembly protects these resistor packages from the significant forces, provided by the clamping mechanism, necessary to provide sufficient electrical contact between the resistor packages of the termination board and the connector arrangement of the PCB. Moreover, this bus termination mounting assembly protects the surface-mount resistors from inadvertent damage caused by routine handling of the PCB. Lastly, the bus termination mounting assembly of the present invention is relatively easy and inexpensive to manufacture.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principals of the invention. Other embodiments of the present invention and many of the intended advantages of the present invention will be readily appreciated as the same become better understood by reference to the following detailed description when considered in connection with the accompanying drawings, in which like reference numerals designate like parts throughout the figures thereof, and wherein.

DETAILED DESCRIPTION OF THE PREFERRED EMBODIMENTS

Figure 1:
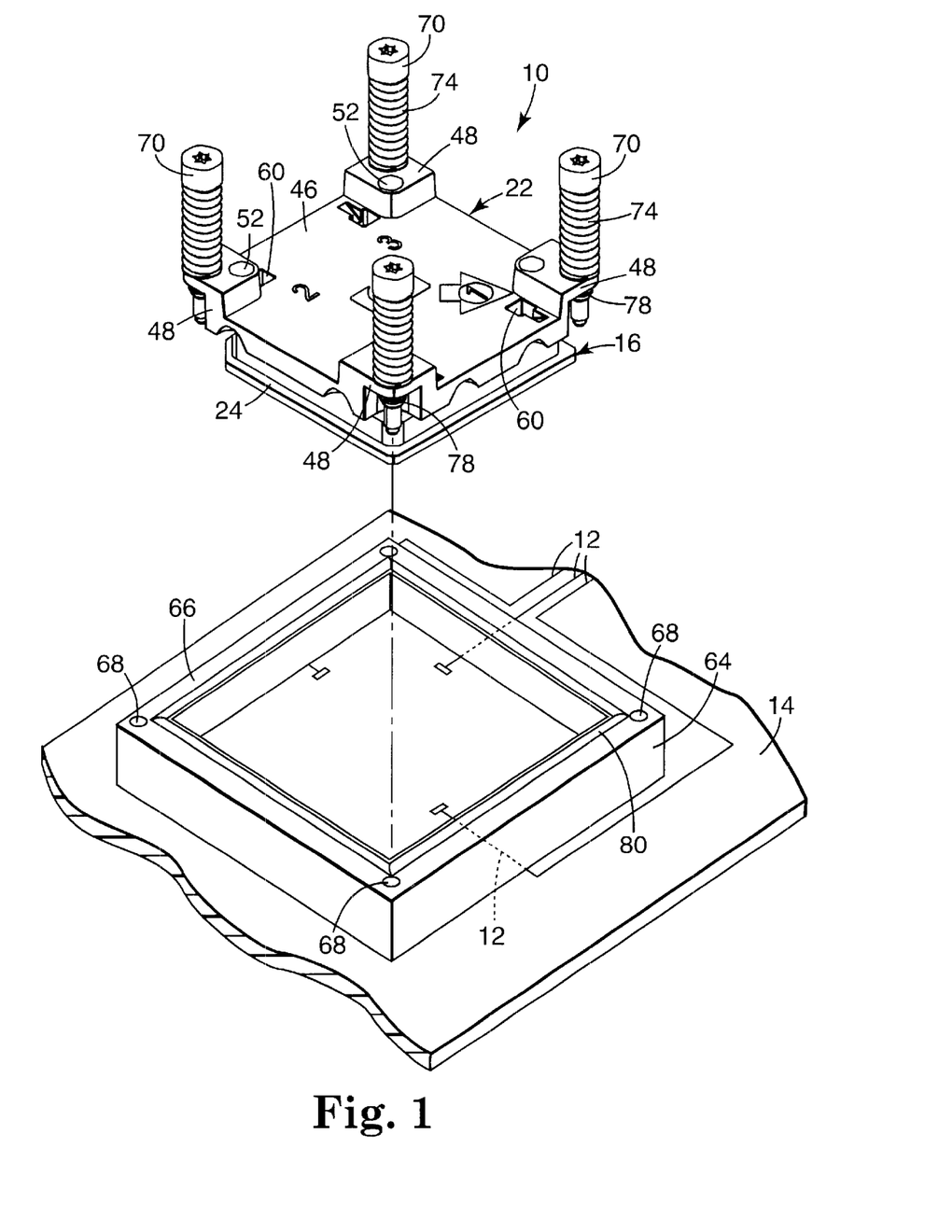
FIG. 1 is an exploded perspective view of a bus termination mounting assembly for providing bus termination of a signal line of a PCB in accordance with the present invention.

A field replaceable unit (FRU) otherwise known as a mounting assembly 10 for providing bus termination of at least one signal line 12 on a printed circuit board (PCB) 14 in accordance with the present invention is generally illustrated in FIG. 1. In FIG. 1, the PCB 14 is illustrated has including three signal lines 12. However, it is to be understood that the PCB 14 could have any number of signal lines 12 needing bus termination using the bus termination mounting assembly 10 of the present invention. As seen best in FIGS. 2 and 3, the bus termination mounting assembly 10 includes a connector arrangement 16, a bus termination device 18, a pressure plate member 20 and a clamping mechanism 22 (see FIG. 3).

Figure 2:
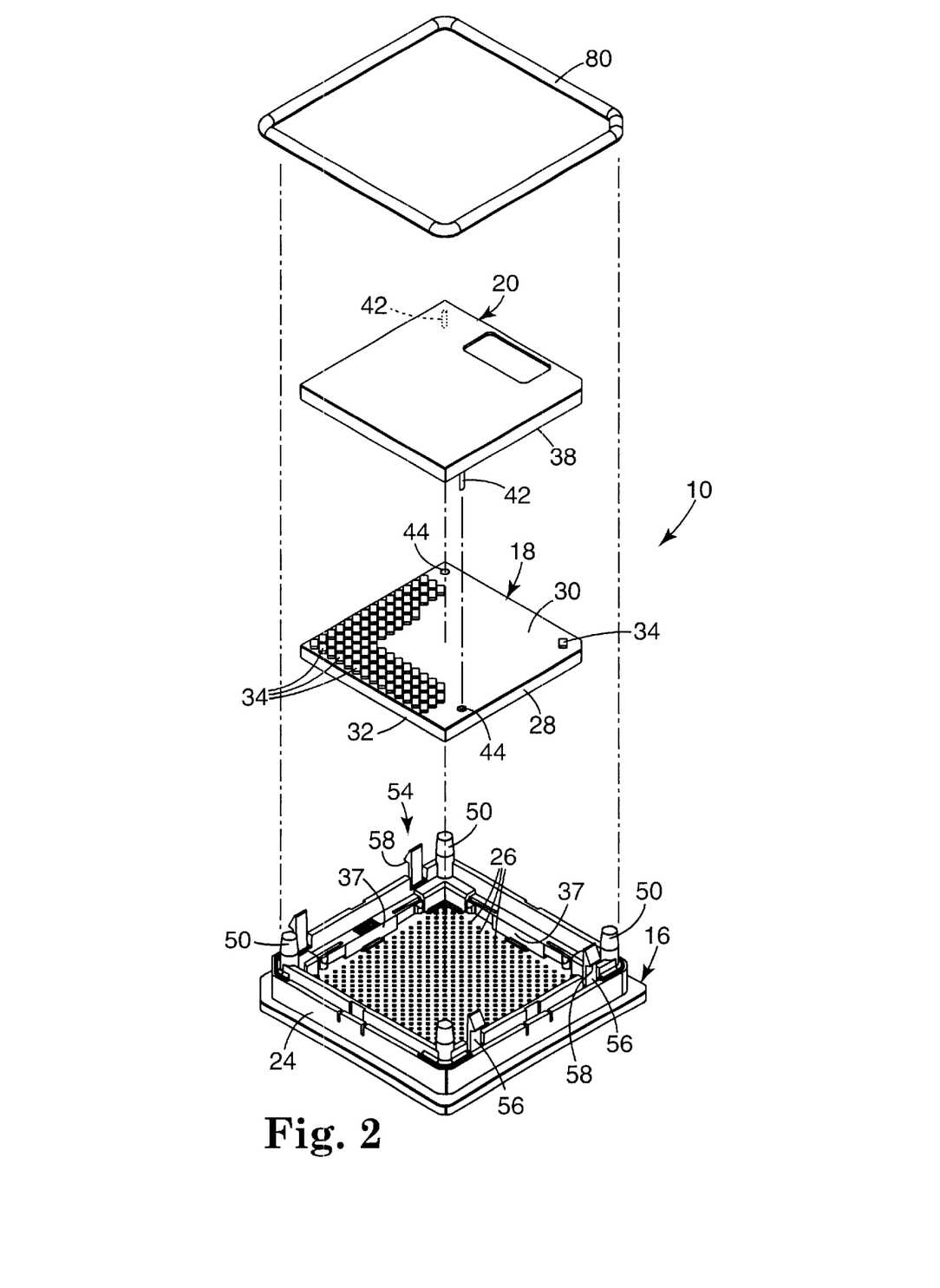
FIG. 2 is an exploded perspective view of a connector arrangement, bus termination device and pressure plate member of the bus termination mounting assembly shown in FIG. 1.

The connector arrangement 16 is defined by a socket 24 that includes a plurality of electrical interface elements 26 configured to provide in a known manner electrical communication between the socket 24 and the at least one signal line 12 of the PCB 14 when the socket 24 is secured to the PCB 14. As seen best in FIGS. 2, 4a and 4b, the bus termination device 18 is defined by a bus termination board 28 having a first surface 30 and an opposite second surface 32. The first surface 30 includes a plurality of spaced surface-mount resistor packages 34 operatively electrically connected to a plurality of corresponding electrical interface elements 36 (FIGS. 4a, 4b) on the second surface 32 of the bus termination board 28. The bus termination board 28 is configured to be received by the socket 24 such that the plurality of corresponding electrical interface elements 36 of the bus termination board 28 engage the plurality of electrical interface elements 26 of the socket 24 so that the resistor packages 34 provide bus termination of the at least one signal line 12 of the PCB 14. As seen in FIG. 2, the socket 24 includes a plurality of spaced alignment features defined by wall portions 37 (only two of which can be seen) for engaging the peripheral edge of the bus termination board 28 to insure that the bus termination board 28 is properly aligned to the socket 24, such that the plurality of corresponding electrical interface elements 36 of the bus termination board 28 properly engage the plurality of electrical interface elements 26 of the socket 24.

In one preferred embodiment, the electrical interface elements 26 and 36 are each of a land grid array (LGA) design. However, it is to be understood that the electrical interface elements 26, 36 could have another form such as a ball grid array (BGA) design or a pin grid array (PGA) design.

Figure 4A:
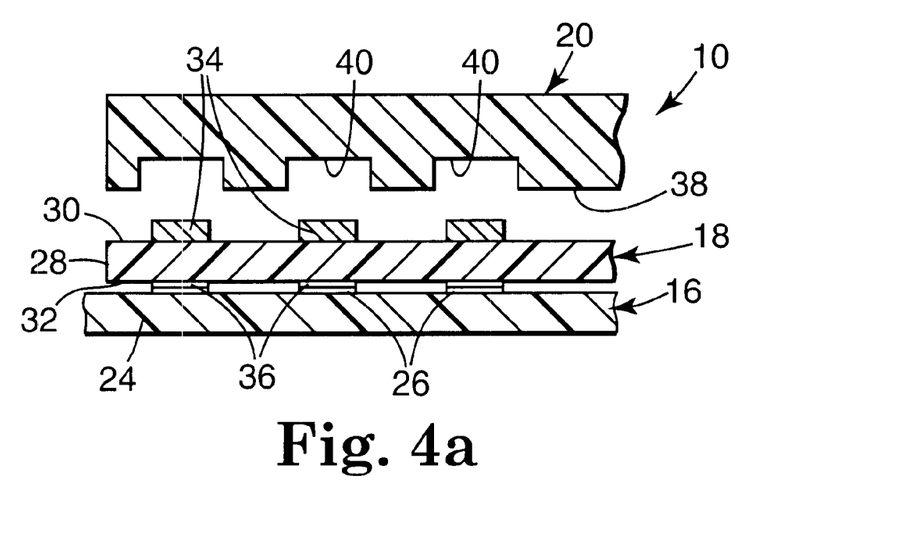
FIG. 4a is a partial sectional view showing the pressure plate member disengaged from the bus termination device.
Figure 4B:
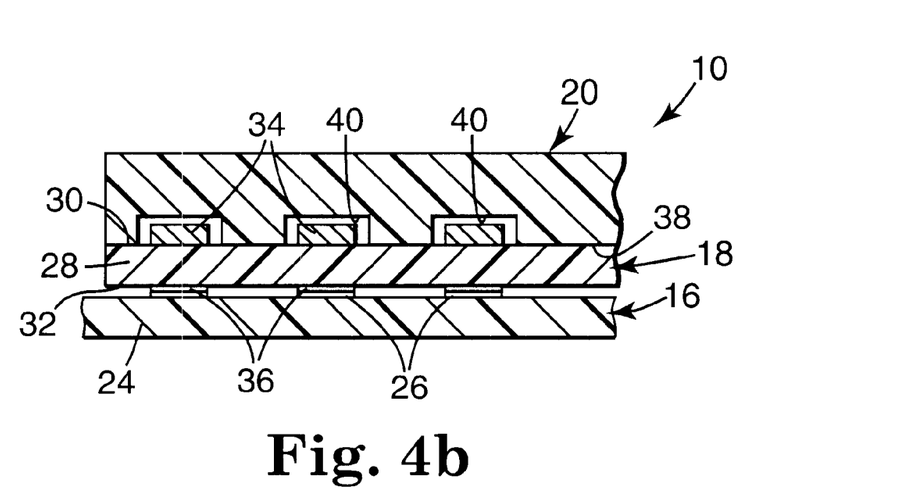
FIG. 4b is a partial sectional view similar to FIG. 4a showing the pressure plate member engaged with the bus termination device.
Figure 5:
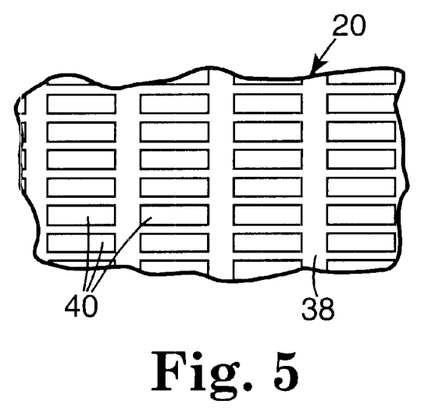
FIG. 5 is a partial elevational view illustrating resistor package pockets on a lower surface of the pressure plate member.

As seen in 2, 3, 4a and 4b, the pressure plate member 20 engages the first surface 30 of the bus termination board 28. As seen in FIGS. 4a, 4b and 5, a lower surface 38 of the pressure plate member 20 defines a plurality of resistor package pockets 40 for receiving the plurality of spaced resistor packages 34 of the bus termination board 28. The pressure plate member 20, and in particular, the resistor package pockets 40 protect the resistor packages 34 from damage by substantially prevent clamping forces imparted by the clamping mechanism 22 to the bus termination board 28 through the pressure plate member 20 from being imparted to the spaced resistor packages 34. As can be seen in FIG. 4b, since the lower surface 38 of the pressure plate member 20 directly engages the first surface 30 of the bus termination board 28 and the resistor package pockets 40 provide a protective space about each of the resistor packages 34, the pressure plate member 20 prevents clamping forces provided by the clamping mechanism 22 from being directly imparted to the resistor packages 34. As can be seen in FIG. 2, the pressure plate member 20 includes a guide feature defined by a pair of spaced guide pins 42. The bus termination board 28 includes a corresponding guide feature defined by a pair of corresponding spaced openings 44. The guide openings 44 are adapted to receive the guide pins 42 to align the pressure plate member 20 of the bus termination board 28.

In one preferred embodiment, the pressure plate member is formed of injection molded plastic.

Figure 3:
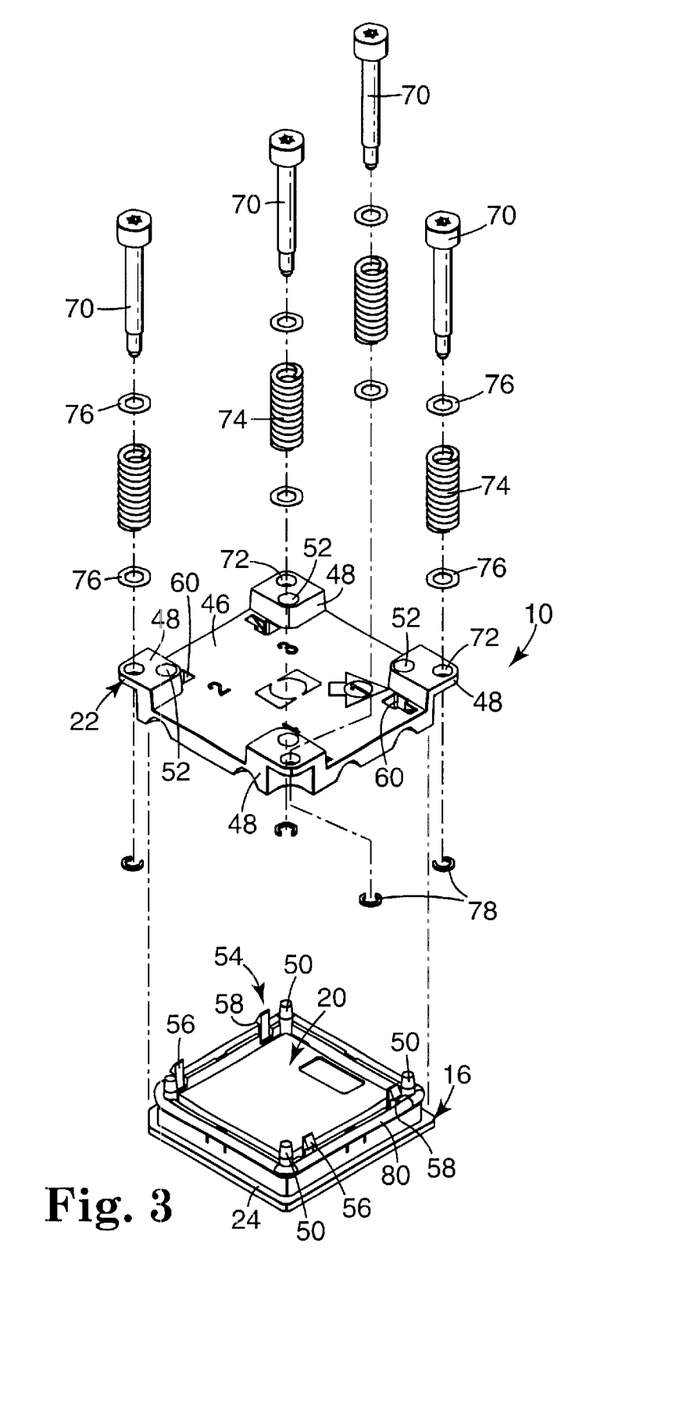
FIG. 3 is an exploded perspective view of a clamping mechanism and the connector arrangement, bus termination device and pressure plate member of FIG. 2.

As seen in FIG. 3, the clamping mechanism 22 includes a clamp plate 46 having four spaced mounting lugs 48. The clamp plate 46 of the clamping mechanism 22 is adapted to engage the pressure plate member 20 to provide a clamping force that acts through the pressure plate member 20 to the bus termination board 28 to insure electrical contact between the corresponding electrical interface elements 36 of the bus termination board 28 and the electrical interface elements 26 of the socket 24. In addition, the clamping mechanism 22 secures to socket 24, bus termination board 28 and pressure plate member 20 to the PCB 14 so the bus termination board 28 can provide bus termination of the at least one signal line 12. As seen in FIG. 3, to align the clamp plate 46 of the clamping mechanism 22 to the socket 24, the socket 24 includes a guide feature defined by a plurality of spaced guide rods 50. The mounting lugs 48 of the clamp plate 46 include a corresponding guide feature defined by a plurality of spaced corresponding guide apertures 52. The guide apertures 52 are adapted to slidably receive the guide rods 50 to align the clamp plate 46 to the socket 24.

Figure 6A:
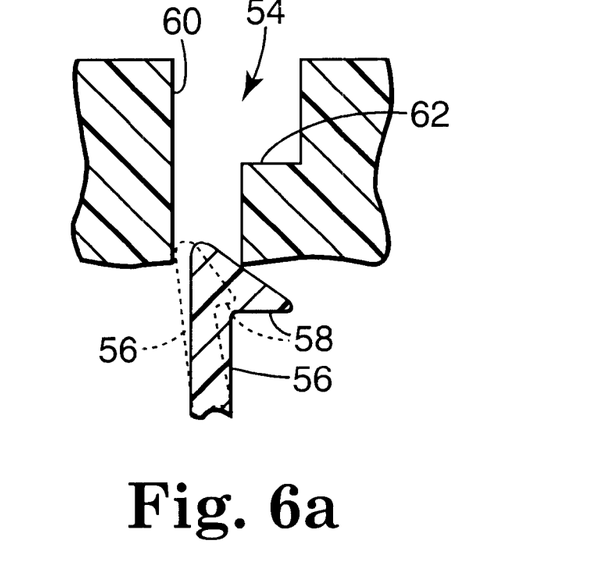
FIG. 6a is partial sectional view showing latch members and latch openings of the connector arrangement and the clamping mechanism in a disengaged state.
Figure 6B:
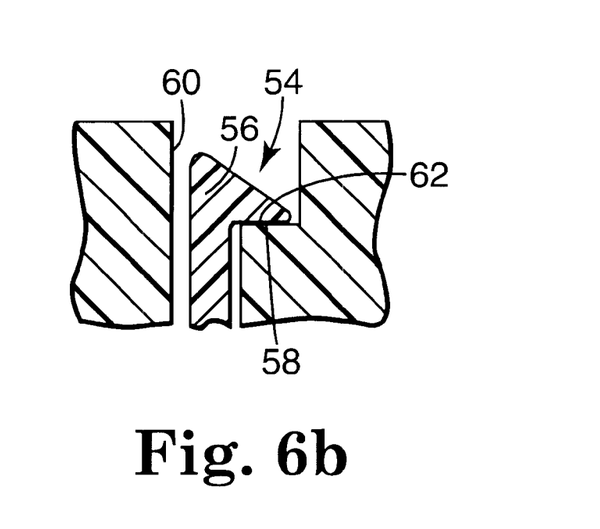
FIG. 6b is partial sectional view similar to FIG. 6a showing the latch members and latch openings of the connector arrangement and the clamping mechanism in an engaged state.
Figure 7:
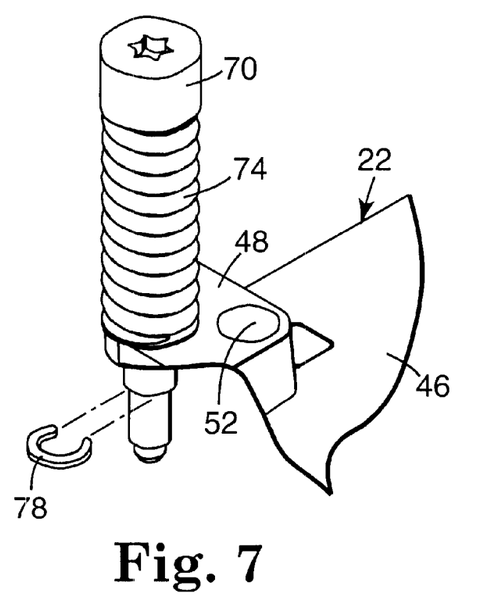
FIG. 7 is an enlarged partial perspective view of a threaded fastening element of the clamping mechanism in accordance with the present invention.
Figure 8:
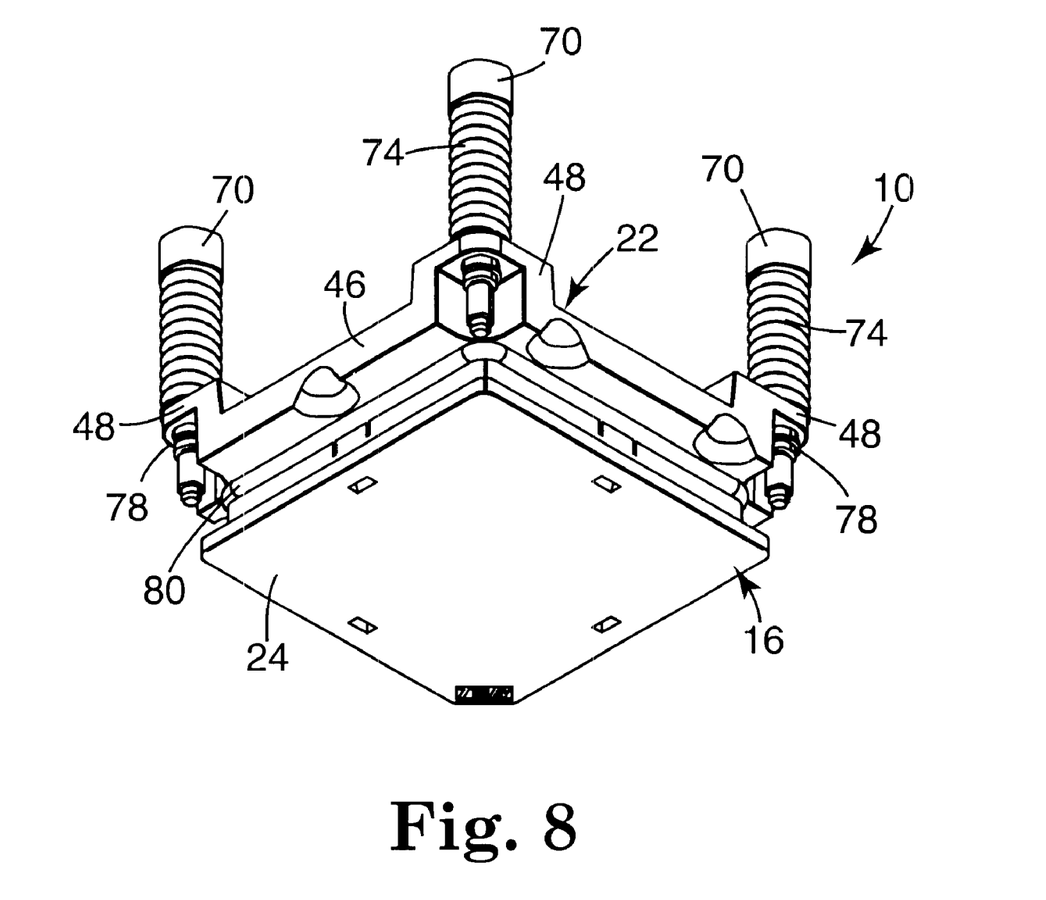
FIG. 8 is perspective view of the bottom of the bus termination mounting assembly shown in FIG. 1.

As seen in FIGS. 3, 6a and 6b, to provide the clamping forces that act on the bus termination board 28 through the pressure plate member 20, the clamping mechanism 22 and the socket 24 include a latch mechanism 54 that releasably secures the clamping mechanism 22 to the socket 24. The latch mechanism 54 includes a latching feature on the socket 24 that is configured to engage a corresponding latching feature of the clamp plate 46. The latching feature of the socket 24 is defined by a plurality of spaced resilient latch members 56 having a latch portion 58. The corresponding latching feature of the clamp plate 46 is defined by a plurality of spaced corresponding latch openings 60 defined in the clamp plate 46. Each latch opening 60 includes a latch ledge 62 that is adapted to be engaged by the latch portion 58 of the corresponding resilient latch member 56 to secure the clamp plate 46 to the 24 and to impart the clamping forces to the bus termination board 28 through the pressure plate member 20 for maintaining electrical contact between the plurality of corresponding electrical interface elements 36 of the bus termination board 28 and the plurality of electrical interface elements 26 of the socket 24. As seen in FIGS. 6a and 6b, the resilient latch members 56 flex, like a "living hinge" upon being received by the latch openings 60 allowing the latch portions 58 of the latch members 56 to form a snap-fit attachment with the latch ledges 62 of the latch openings 60. To release the latch members 56 from the latch openings 60 in order to remove the clamp plate 46 from the socket 24, the latch members 56 are simply flexed using a tool, such as a screw driver, which disengages the latch portions 58 from the latch ledges 62 and allows removal of the clamp plate 46.

As can be seen in FIG. 1, the PCB 14 includes a mounting frame 64 for mounting the FRU, otherwise known as the mounting assembly 10, defined by the connector arrangement 16, bus termination device 18, pressure plate member 20 and clamping mechanism 22 to the PCB 14 for providing bus termination for the at least one signal line 12. The mounting frame 64 has an upper edge surface 66, and a fastening feature defined by a plurality of spaced threaded fastening openings 68. The mounting lugs 48 of the clamp plate 46 of the clamping mechanism 22 include a corresponding fastening feature defined by a plurality of threaded fastening elements 70 that are adapted to threadably engage the threaded fastening openings 68 of the mounting frame 64 to secure the clamp plate 46, pressure plate member 20, bus termination board 28 and socket 24 to the mounting frame 64 on the PCB 14 for insuring electrical contact between the plurality of electrical interface elements 26 of the socket 24 and the at least one signal line 12 on the PCB 14.

As seen best in FIG. 3, each threaded fastening element 70 is freely rotatably received in a corresponding through aperture 72 of a corresponding mounting lug 48 of the clamp plate 46. Each threaded fastening element 70 includes a compression spring member 74 positioned between a pair of washers 76. The spring members 74 bias the threaded fastening elements 70 away from the clamp plate 46. Each of the threaded fastening elements 70 is secured to the corresponding mounting lug 48 against the bias of the spring members 74 by way of a C-clip 78. The spring members 74 act to position the threaded fastening elements 70 to allow these elements 70 to be quickly and readily engaged with the threaded fastening openings 68 once the mounting assembly (i.e., FRU) is positioned atop the mounting frame 64. As seen in FIG. 1, an electromagnetic interference (EMI) gasket 80 is positioned between the clamp plate 46 and the upper edge surface 66 of the mounting frame 64 to provide EMI containment.

To provide bus termination of the at least one signal line 12 of the PCB 14, first the bus termination board 28 is inserted into the socket 24 using the alignment wall portions 37 such that the corresponding electrical interface elements 36 of the bus termination board engage the electrical interface elements 26 of the socket 24. Next, the pressure plate member 20 is placed on top of the bus termination board 28 using the guide pins 42 and openings 44 such that the resistor package pockets 40 of the pressure plate member 20 surround the resistor packages 34 on the bus termination board 28. Next, the clamp plate 46 of the clamping mechanism 22 is engaged with the socket 24 using the guide rods 50 and guide apertures 52. The clamp plate 46 is secured to the socket 24 via the latch members 56 and the latch openings 60. Engagement of the latch members 56 with the latch openings 60 provides an evenly distributed clamping force against the pressure plate member 20 that acts against the bus termination board 28 to insure adequate electrical contact between the electrical interface elements 26, 36 of the socket 24 and the bus termination board 28. The resistor package pockets 40 of the pressure plate member prevent these clamping forces from being imparted to the resistor packages 34. This completes the assembly of the bus termination mounting assembly (i.e., FRU) 10.

This FRU 10 is then placed atop the mounting frame 64 of the PCB with the EMI gasket 80 between the upper edge surface 66 of the mounting frame 64 and the clamp plate 46. Next, the threaded fasteners 70 are engaged with the threaded openings 68, and the fasteners 70 are tightened against the bias of the springs 74 to secure the FRU 10 to the mounting frame 64 of the PCB 14 thereby allowing the resistor packages 34 to provide bus termination of the signal lines 12.

This mounting assembly (i.e., FRU) 10 for providing bus termination for a signal line 1, of the present invention, makes use of resistor packages 34 surface mounted to a bus termination board 28 to permit mass production and eliminate the need to individually hand load the resistors onto the connector arrangement of the PCB. In addition, the pressure plate member 20 of this bus termination mounting assembly 10 protects these resistor packages 34 from the significant forces, provided by the clamping mechanism 22, necessary to provide sufficient electrical contact between the resistor packages 34 of the termination board 28 and the connector arrangement 16 of the PCB 14. Moreover, this bus termination mounting assembly 10 protects the surface-mount resistors 34 from inadvertent damage caused by routine handling of the PCB 14. Lastly, the bus termination mounting assembly 10 of the present invention is relatively easy and inexpensive to manufacture.

Although the present invention has been described with reference to preferred embodiments, workers skilled in the art will recognize that changes may be made in form and detail without departing from the spirit and scope of the invention.

What is claimed is:

1. A mounting assembly for providing bus termination of at least one signal line on a printed circuit board (PCB), the mounting assembly comprising:
   a connector arrangement including a latching feature and a plurality of electrical interface elements configured to provide electrical communication between the connector arrangement and the at least one signal line of the PCB when the connector arrangement is secured to the PCB;
   a bus termination device configured to be received by the connector arrangement, the bus termination device having a plurality of corresponding electrical interface elements for engaging the plurality of electrical interface elements of the connector arrangement for providing bus termination of the at least one signal line of the PCB; and
   a clamping mechanism engageable with the bus termination device, the clamping mechanism including a corresponding latching feature configured to engage the latching feature of the connector arrangement to secure the clamping mechanism to the connector arrangement for maintaining electrical contact between the plurality of corresponding electrical interface elements of the bus termination device and the plurality of electrical interface elements of the connector arrangement, the clamping mechanism further including a fastening feature for securing the clamping mechanism, connector arrangement and bus termination device to the PCB.

2. The mounting assembly of claim 1, and further including:
   a pressure plate member interposed between the clamping mechanism and the bus termination device, the pressure plate member protecting the bus termination device from damage as a result of clamping forces imparted by the clamping mechanism to the bus termination device through the pressure plate member.

3. The mounting assembly of claim 1 wherein the connector arrangement includes a plurality of spaced alignment features for insuring that the bus termination device is properly aligned to the connector arrangement, such that the plurality of corresponding electrical interface elements of the bus termination device properly engage the plurality of electrical interface elements of the connector arrangement.

4. The mounting assembly of claim 1 wherein the bus termination device includes a bus termination board having a first surface and an opposite second surface, the first surface including a plurality of spaced resistor packages operatively connected to the plurality of corresponding electrical interface elements on the second surface of the bus termination board.

5. The mounting assembly of claim 4 wherein the plurality of spaced resistor packages are a plurality of spaced surface-mount resistor packages.

6. The mounting assembly of claim 4, and further including:
   a pressure plate member interposed between the clamping mechanism and the bus termination board, the pressure plate member protecting the plurality of spaced resistor packages from damage as a result of clamping forces imparted by the clamping mechanism to the bus termination board through the pressure plate member.

7. The mounting assembly of claim 6 wherein the pressure plate member defines a plurality of resistor package pockets for receiving the plurality of spaced resistor packages, the resistor package pockets substantially preventing the clamping forces imparted by the clamping mechanism to the bus termination board from being imparted to the plurality of spaced resistor packages.

8. The mounting assembly of claim 6 wherein the connector arrangement includes a plurality of spaced alignment features for insuring that the bus termination board is properly aligned to the connector arrangement, such that the plurality of corresponding electrical interface elements of the bus termination board properly engage the plurality of electrical interface elements of the connector arrangement.

9. The mounting assembly of claim 6 wherein the pressure plate member includes a guide feature, and wherein the bus termination board includes a corresponding guide feature, the guide feature being engageable with the corresponding guide feature to align the pressure plate member on the bus termination board.

10. The mounting assembly of claim 9 wherein the guide feature of the pressure plate member is a pair of spaced guide pins, and wherein the corresponding guide feature of the bus termination board is a pair of corresponding spaced openings defined in the bus termination board for receiving the pair of spaced guide pins.

11. The mounting assembly of claim 1 wherein the clamping mechanism includes a clamp plate having the corresponding latching feature and the fastening feature.

12. The mounting assembly of claim 11 wherein the latching feature of the connector arrangement is a plurality of spaced latch members, and wherein the corresponding latching feature of the clamp plate is a plurality of spaced corresponding latch openings defined in the clamp plate for receiving the plurality of spaced latch members to secure the clamp plate to the connector arrangement.

13. The mounting assembly of claim 1 wherein the connector arrangement includes a guide feature, and wherein the clamping mechanism includes a clamp plate having a corresponding guide feature, the corresponding guide feature of the clamp plate being configured to engage the guide feature of the connector arrangement to align the clamp plate to the connector arrangement.

14. The mounting assembly of claim 13 wherein the guide feature of the connector arrangement is a plurality of spaced guide rods, and wherein the corresponding guide feature of the clamp plate is a plurality of spaced corresponding guide openings defined in the clamp plate for receiving the plurality of spaced guide rods to align the clamp plate to the connector arrangement.

15. The mounting assembly of claim 14 wherein the clamp plate has the corresponding latching feature and the fastening feature.

16. The mounting assembly of claim 15 wherein the latching feature of the connector arrangement is a plurality of spaced latch members, and wherein the corresponding latching feature of the clamp plate is a plurality of spaced corresponding latch openings defined in the clamp plate for receiving the plurality of spaced latch members to secure the clamp plate to the connector arrangement.

17. The mounting assembly of claim 16, and further including:
   a connector arrangement mounting frame mountable to the PCB, the connector arrangement mounting frame having a corresponding fastening feature, the fastening feature of the clamp plate being configured to engage the corresponding fastening feature of the connector arrangement mounting frame to secure the clamp plate, bus termination device and connector arrangement to the connector arrangement mounting frame for insuring electrical contact between the plurality of electrical interface elements of the connector arrangement and the at least one signal line of the PCB.

18. The mounting assembly of claim 17 wherein the fastening feature of the clamp plate is a plurality of spaced fastening elements, and wherein the corresponding fastening feature of the connector arrangement mounting frame is a plurality of spaced corresponding fastening openings defined in the connector arrangement mounting frame for receiving the plurality of spaced fastening elements to secure the clamp plate, bus termination device and connector arrangement to the connector arrangement mounting frame.

19. The mounting assembly of claim 18 wherein each fastening opening of the plurality of spaced corresponding fastening openings is a threaded opening, and wherein each fastening element of the plurality of spaced fastening elements is a threaded fastener.

20. The mounting assembly of claim 19 wherein each threaded fastener includes a spring member for biasing the threaded fastener.

21. The mounting assembly of claim 1, and further including:
a connector arrangement mounting frame mountable to the PCB, the connector arrangement mounting frame having a corresponding fastening feature, fastening feature of the clamping mechanism being configured to engage the corresponding fastening feature of the connector arrangement mounting frame to secure the clamping mechanism, bus termination device and connector arrangement to the connector arrangement mounting frame for insuring electrical contact between the plurality of electrical interface elements of the connector arrangement and the at least one signal line of the PCB.

22. The mounting assembly of claim 21 wherein the fastening feature of the clamping mechanism is a plurality of spaced fastening elements, and wherein the corresponding fastening feature of the connector arrangement mounting frame is a plurality of spaced corresponding fastening openings defined in the connector arrangement mounting frame for receiving the plurality of spaced fastening elements to secure the clamping mechanism, bus termination device and connector arrangement to the connector arrangement mounting frame.

23. The mounting assembly of claim 22 wherein each fastening opening of the plurality of spaced corresponding fastening openings is a threaded opening, and wherein each fastening element of the plurality of spaced fastening elements is a threaded fastener.

24. The mounting assembly of claim 23 wherein each threaded fastener includes a spring member for biasing the threaded fastener.

25. The mounting assembly of claim 5 wherein the clamping mechanism includes a clamp plate having the corresponding latching feature and the fastening feature, the corresponding latching feature of the clamp plate being configured to engage the latching feature of the connector arrangement to secure the clamp plate to the connector arrangement and to impart the clamping forces to the bus termination board through the pressure plate for maintaining electrical contact between the plurality of corresponding electrical interface elements of the bus termination board and the plurality of electrical interface elements of the connector arrangement.

26. The mounting assembly of claim 25 wherein the latching feature of the connector arrangement is a plurality of spaced latch members, and wherein the corresponding latching feature of the clamp plate is a plurality of spaced corresponding latch openings defined in the clamp plate for receiving the plurality of spaced latch members to secure the clamp plate to the connector arrangement.

27. The mounting assembly of claim 6 wherein the connector arrangement includes a guide feature, and wherein the clamping mechanism includes a clamp plate having a corresponding guide feature, the corresponding guide feature of the clamp plate being configured to engage the guide feature of the connector arrangement to align the clamp plate to the connector arrangement.

28. The mounting assembly of claim 27 wherein the guide feature of the connector arrangement is a plurality of spaced guide rods, and wherein the corresponding guide feature of the clamp plate is a plurality of spaced corresponding guide openings defined in the clamp plate for receiving the plurality of spaced guide rods to align the clamp plate to the connector arrangement.

29. The mounting assembly of claim 28 wherein the clamp plate has the corresponding latching feature and the fastening feature, the corresponding latching feature of the clamp plate being configured to engage the latching feature of the connector arrangement to secure the clamp plate to the connector arrangement and to impart the clamping forces to the bus termination board through the pressure plate for maintaining electrical contact between the plurality of corresponding electrical interface elements of the bus termination board and the plurality of electrical interface elements of the connector arrangement.

30. The mounting assembly of claim 29 wherein the latching feature of the connector arrangement is a plurality of spaced latch members, and wherein the corresponding latching feature of the clamp plate is a plurality of spaced corresponding latch openings defined in the clamp plate for receiving the plurality of spaced latch members to secure the clamp plate to the connector arrangement.

31. The mounting assembly of claim 30, and further including:
a connector arrangement mounting frame mountable to the PCB, the connector arrangement mounting frame having a corresponding fastening feature, the fastening feature of the clamp plate being configured to engage the corresponding fastening feature of the connector arrangement mounting frame to secure the clamp plate, pressure plate member, bus termination board and connector arrangement to the connector arrangement mounting frame for insuring electrical contact between the plurality of electrical interface elements of the connector arrangement and the at least one signal line of the PCB.

32. The mounting assembly of claim 31 wherein the fastening feature of the clamp plate is a plurality of spaced fastening elements, and wherein the corresponding fastening feature of the connector arrangement mounting frame is a plurality of spaced corresponding fastening openings defined in the connector arrangement mounting frame for receiving the plurality of spaced fastening elements to secure the clamp plate, pressure plate member, bus termination board and connector arrangement to the connector arrangement mounting frame.

33. The mounting assembly of claim 32 wherein each fastening opening of the plurality of spaced corresponding fastening openings is a threaded opening, and wherein each fastening element of the plurality of spaced fastening elements is a threaded fastener.

34. The mounting assembly of claim 6, and further including:
   a connector arrangement mounting frame mountable to the PCB, the connector arrangement mounting frame having a corresponding fastening feature, fastening feature of the clamping mechanism being configured to engage the corresponding fastening feature of the connector arrangement mounting frame to secure the clamping mechanism, pressure plate member, bus termination board and connector arrangement to the connector arrangement mounting frame for insuring electrical contact between the plurality of electrical interface elements of the connector arrangement and the at least one signal line on of the PCB.

35. The mounting assembly of claim 34, and further including:
   an electromagnetic interference gasket positioned between the clamping mechanism and the connector arrangement mounting frame.

36. The mounting assembly of claim 34 wherein the fastening feature of the clamping mechanism is a plurality of spaced fastening elements, and wherein the corresponding fastening feature of the connector arrangement mounting frame is a plurality of spaced corresponding fastening openings defined in the connector arrangement mounting frame for receiving the plurality of spaced fastening elements to secure the clamping mechanism, bus termination device and connector arrangement to the connector arrangement mounting frame.

37. The mounting assembly of claim 36 wherein each fastening opening of the plurality of spaced corresponding fastening openings is a threaded opening, and wherein each fastening element of the plurality of spaced fastening elements is a threaded fastener.

38. The mounting assembly of claim 37 wherein each threaded fastener includes a spring member for biasing the threaded fastener.

39. A mounting assembly for providing bus termination of at least one signal line on a printed circuit board (PCB), the mounting assembly comprising:
   a connector arrangement including a plurality of electrical interface elements configured to provide electrical communication between the connector arrangement and the at least one signal line of the PCB when the connector arrangement is secured to the PCB;
   a bus termination board configured to be received by the connector arrangement, the bus termination board having a first surface that includes a plurality of corresponding electrical interface elements for engaging the plurality of electrical interface elements of the connector arrangement, and a second surface having a plurality of spaced resistor packages for providing bus termination of the signal line of the PCB; and
   a pressure plate member engaging the second surface of the bus termination board, the pressure plate member defining a plurality of resistor package pockets for receiving the plurality of spaced resistor packages, the resistor package pockets protecting the plurality of spaced resistor packages from damage.

40. The mounting assembly of claim 39, and further including:
   a clamping mechanism engageable with the pressure plate member for imparting clamping forces to the bus termination board through the pressure plate member for maintaining electrical contact between the plurality of corresponding electrical interface elements of the bus termination board and the plurality of electrical interface elements of the connector arrangement, the pressure plate member preventing the clamping forces imparted by the clamping mechanism to the bus termination board from being imparted to the plurality of spaced resistor packages.

* * * * *